(12) United States Patent
Zierak et al.

(10) Patent No.: US 11,664,412 B2
(45) Date of Patent: May 30, 2023

(54) STRUCTURE PROVIDING POLY-RESISTOR UNDER SHALLOW TRENCH ISOLATION AND ABOVE HIGH RESISTIVITY POLYSILICON LAYER

(71) Applicant: GLOBALFOUNDRIES U.S. Inc., Santa Clara, CA (US)

(72) Inventors: Michael J. Zierak, Colchester, VT (US); Siva P. Adusumilli, South Burlington, VT (US); Yves T. Ngu, Essex Junction, VT (US); Steven M. Shank, Jericho, VT (US)

(73) Assignee: GlobalFoundries U.S. Inc., Santa Clara, CA (US)

( * ) Notice: Subject to any disclaimer, the term of this patent is extended or adjusted under 35 U.S.C. 154(b) by 0 days.

(21) Appl. No.: 17/155,445

(22) Filed: Jan. 22, 2021

(65) Prior Publication Data

US 2022/0238631 A1 Jul. 28, 2022

(51) Int. Cl.
*H01L 21/762* (2006.01)
*H01L 27/06* (2006.01)
*H01L 49/02* (2006.01)

(52) U.S. Cl.
CPC ........ *H01L 28/20* (2013.01); *H01L 21/76224* (2013.01); *H01L 27/0629* (2013.01)

(58) Field of Classification Search
CPC .............. H01L 28/20; H01L 21/76224; H01L 27/0629; H01L 27/0605; H01L 21/8252; H01L 29/4238
USPC .................................. 257/506; 438/207, 218
See application file for complete search history.

(56) References Cited

U.S. PATENT DOCUMENTS

| | | |
|---|---|---|
| 8,377,790 B2 | 2/2013 | Kanike et al. |
| 8,735,986 B2 | 5/2014 | Botula et al. |
| 8,962,420 B2 | 2/2015 | Kurz et al. |
| 9,716,136 B1 | 7/2017 | Abou-Khalil et al. |
| 10,192,779 B1 | 1/2019 | Shank et al. |
| 2007/0194390 A1* | 8/2007 | Chinthakindi et al. ..................... H01L 29/8605 257/379 |
| 2011/0108919 A1 | 5/2011 | Chinthakindi et al. |
| 2016/0225659 A1* | 8/2016 | Jacob et al. ...... H01L 21/76213 438/407 |
| 2016/0358905 A1* | 12/2016 | Balakrishnan et al. ..................... H01L 29/0629 257/379 |
| 2021/0217849 A1* | 7/2021 | Jain et al. ........... H01L 29/1087 |

OTHER PUBLICATIONS

"Bulk Semiconductor Structure With a Multi-Level Polycrystalline Semiconductor Region and Method", U.S. Appl. No. 16/992,165, filed Aug. 13, 2020.

\* cited by examiner

*Primary Examiner* — Thinh T Nguyen
(74) *Attorney, Agent, or Firm* — Anthony Canale; Hoffman Warnick LLC

(57) ABSTRACT

A structure provides a polysilicon resistor under a shallow trench isolation (STI). The structure includes the STI, a resistor in the form of a doped buried polysilicon layer under the STI, and a high resistivity (HR) polysilicon layer under the doped buried polysilicon layer. The structure also includes a pair of contacts operatively coupled in a spaced manner to the doped buried polysilicon layer. A related method is also disclosed.

15 Claims, 7 Drawing Sheets

STRUCTURE PROVIDING POLY-RESISTOR UNDER SHALLOW TRENCH ISOLATION AND ABOVE HIGH RESISTIVITY POLYSILICON LAYER

BACKGROUND

The present disclosure relates to integrated circuits (IC), and more specifically, to a structure providing a polysilicon resistor under a shallow trench isolation (STI) and above a high resistivity polysilicon layer.

Resistors for an IC are oftentimes formed in inter-layer dielectric (ILD) layers above the transistors. These layers are referred to as middle-of-line (MOL) layers and back-end-of-line (BEOL) layers. MOL layers are just above the front-end-of-line (FEOL) layers that include the transistors, and BEOL layers are above the MOL layers. Both MOL and BEOL layers provide scaling interconnects for the IC. The resistors are oftentimes formed over an oxide or STI, which reduces thermal dissipation from the resistor into the substrate. For polysilicon resistors placed on the surface of a substrate, e.g., over STI, resistance variation due to temperature under high current is also a concern. In addition, the resistors extend horizontally within the layers, taking up valuable area and potentially blocking access to other functional components therebelow, requiring complex electrical connections to those components, or addition of more components not covered by the resistor.

SUMMARY

One aspect of the disclosure includes a structure, comprising: a shallow trench isolation (STI); a doped buried polysilicon layer under the STI; a high resistivity (HR) polysilicon layer under the doped buried polysilicon layer; and a pair of contacts operatively coupled in a spaced manner to the doped buried polysilicon layer.

Another aspect of the disclosure is directed to a structure, comprising: a shallow trench isolation (STI); a resistor including a doped buried polysilicon layer under the STI; a high resistivity (HR) polysilicon layer under the resistor; and a pair of contacts operatively coupled in a spaced manner to the resistor, wherein the HR polysilicon layer includes a noble dopant, and wherein the doped buried polysilicon layer includes a boron dopant.

Another aspect of the disclosure includes an aspect of the disclosure related to a method, comprising: forming a shallow trench isolation (STI) in a substrate; doping the substrate with a noble dopant, forming a disordered crystallographic layer under the STI; converting the disordered crystallographic layer to a doped buried polysilicon layer under the STI and a high resistivity (HR) polysilicon layer under the doped buried polysilicon layer; and forming a pair of contacts operatively coupled in a spaced manner to the doped buried polysilicon layer.

The foregoing and other features of the disclosure will be apparent from the following more particular description of embodiments of the disclosure.

BRIEF DESCRIPTION OF THE DRAWINGS

The embodiments of this disclosure will be described in detail, with reference to the following figures, wherein like designations denote like elements, and wherein.

Figure 1:
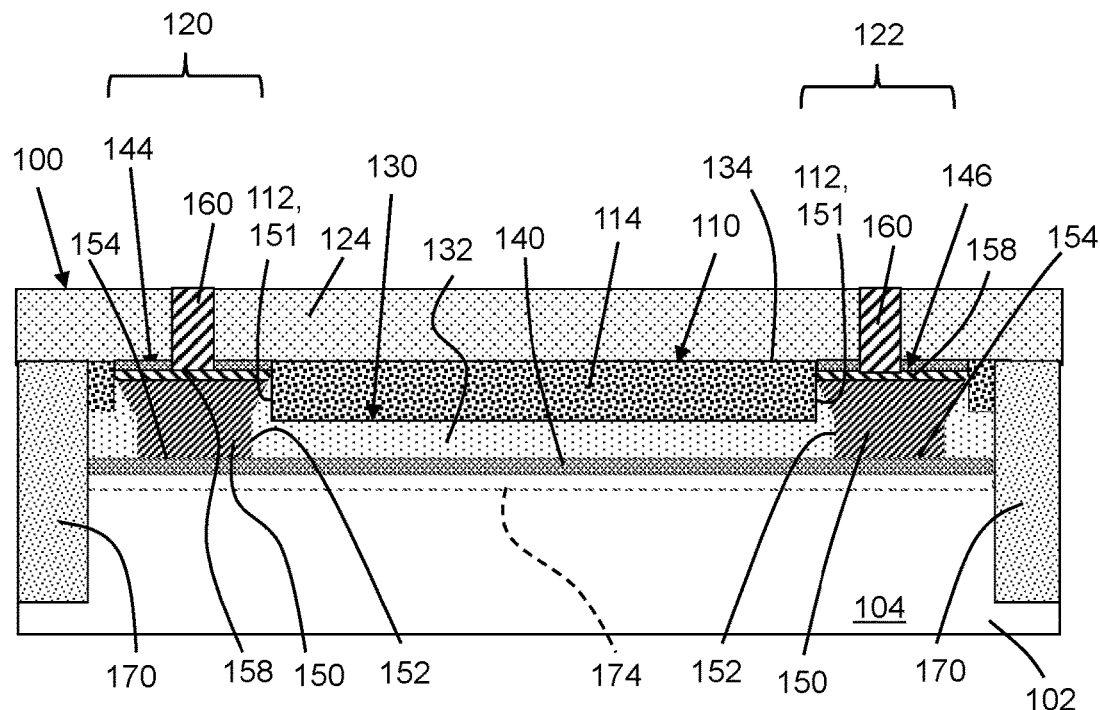
FIG. 1 shows a cross-sectional view of a structure including a poly-resistor, according to embodiments of the disclosure.

It is noted that the drawings of the disclosure are not necessarily to scale. The drawings are intended to depict only typical aspects of the disclosure, and therefore should not be considered as limiting the scope of the disclosure. In the drawings, like numbering represents like elements between the drawings.

DETAILED DESCRIPTION

In the following description, reference is made to the accompanying drawings that form a part thereof, and in which is shown by way of illustration specific illustrative embodiments in which the present teachings may be practiced. These embodiments are described in sufficient detail to enable those skilled in the art to practice the present teachings, and it is to be understood that other embodiments may be used and that changes may be made without departing from the scope of the present teachings. The following description is, therefore, merely illustrative.

It will be understood that when an element such as a layer, region, or substrate is referred to as being "on" or "over" another element, it may be directly on the other element or intervening elements may also be present. In contrast, when an element is referred to as being "directly on" or "directly over" another element, there may be no intervening elements present. It will also be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present.

Reference in the specification to "one embodiment" or "an embodiment" of the present disclosure, as well as other variations thereof, means that a particular feature, structure, characteristic, and so forth described in connection with the embodiment is included in at least one embodiment of the present disclosure. Thus, the phrases "in one embodiment" or "in an embodiment," as well as any other variations appearing in various places throughout the specification are not necessarily all referring to the same embodiment. It is to be appreciated that the use of any of the following "/," "and/or," and "at least one of," for example, in the cases of "A/B," "A and/or B" and "at least one of A and B," is intended to encompass the selection of the first listed option (A) only, or the selection of the second listed option (B) only, or the selection of both options (A and B). As a further example, in the cases of "A, B, and/or C" and "at least one of A, B, and C," such phrasing is intended to encompass the first listed option (A) only, or the selection of the second listed option (B) only, or the selection of the third listed option (C) only, or the selection of the first and the second listed options (A and B), or the selection of the first and third listed options (A and C) only, or the selection of the second and third listed options (B and C) only, or the selection of all three options (A and B and C). This may be extended, as readily apparent by one of ordinary skill in the art, for as many items listed.

Embodiments of the disclosure provide a structure that provides a polysilicon resistor (poly-resistor) under a shallow trench isolation (STI). The structure includes the STI, a resistor in the form of a doped buried polysilicon layer under the STI, and a high resistivity (HR) polysilicon layer under the doped buried polysilicon layer. The structure also includes a pair of contacts operatively coupled in a spaced manner to the doped buried polysilicon layer. A related method is also disclosed. The structure eliminates oxide/STI under the resistor, which improves the resistor's thermal dissipation to the substrate. The structure also allows improved resistor density (with reduced area) by allowing stacked poly-resistors below the STI and above the STI. The HR polysilicon layer provides an isolation region beneath the poly-resistor that diminishes parasitic leakage of active devices to the substrate. In this setting, the HR polysilicon layer also provides thermal conductivity from the poly-resistor with reduced substrate coupling, and improved frequency response.

FIG. 1 shows a cross-sectional view of a structure 100 according to embodiments of the disclosure. Structure 100 is formed over a substrate 102. As illustrated, embodiments of the disclosure may be implemented on a bulk semiconductor substrate 104. However, the teachings of the disclosure may also be implemented on other substrates such as a semiconductor-on-insulator (SOI) substrate (not shown). SOI substrates include a layered semiconductor-insulator-semiconductor substrate in place of a more conventional bulk semiconductor substrate. SOI substrates include a semiconductor-on-insulator (SOI) layer over a buried insulator layer over a base semiconductor layer. Semiconductor substrate 104 may include but is not limited to silicon, germanium, silicon germanium, silicon carbide, and those consisting essentially of one or more III-V compound semiconductors having a composition defined by the formula $Al_{X1}Ga_{X2}In_{X3}As_{Y1}P_{Y2}N_{Y3}Sb_{Y4}$, where X1, X2, X3, Y1, Y2, Y3, and Y4 represent relative proportions, each greater than or equal to zero and X1+X2+X3+Y1+Y2+Y3+Y4=1 (1 being the total relative mole quantity). Other suitable substrates include II-VI compound semiconductors having a composition $Zn_{A1}Cd_{A2}Se_{B1}Te_{B2}$, where A1, A2, B1, and B2 are relative proportions each greater than or equal to zero and A1+A2+B1+B2=1 (1 being a total mole quantity). Where an SOI substrate is employed, the SOI layer and base semiconductor layer may include any of the afore-mentioned semiconductor materials. Furthermore, a portion or entire substrate 102 may be strained. In any event, semiconductor substrate 104 may be provided as an amorphous semiconductor material, e.g., with no wells.

Structure 100 also includes a shallow trench isolation (STI) 110. STI 110 includes a trench 112 etched into substrate 102 and filled with an insulating material 114. In certain embodiments, STI 110 may isolate one region of the substrate from an adjacent region of the substrate. For example, STI 110 may electrically isolate one active region 120 from another active region 122. One or more transistors (not shown) of a given polarity may be disposed within an area isolated by STI 110. Insulating material 114 may include any currently-known or later developed substance for providing electrical insulation, and as examples may include: silicon nitride ($Si_3N_4$), silicon oxide ($SiO_2$), fluorinated $SiO_2$ (FSG), hydrogenated silicon oxycarbide (SiCOH), porous SiCOH, boro-phospho-silicate glass (BPSG), silsesquioxanes, carbon (C) doped oxides (i.e., organosilicates) that include atoms of silicon (Si), carbon (C), oxygen (O), and/or hydrogen (H), thermosetting polyarylene ethers, a spin-on silicon-carbon containing polymer material, near frictionless carbon (NFC), or layers thereof.

As noted, typical poly-resistors (not shown) may be formed over STI 110 in an inter-layer dielectric (ILD) layer 124 thereover. In this case, STI 110 limits heat dissipation into substrate 102. Suitable dielectric materials for ILD layer 124 may include but are not limited to: carbon-doped silicon dioxide materials; fluorinated silicate glass (FSG); organic polymeric thermoset materials; silicon oxycarbide; SiCOH dielectrics; fluorine doped silicon oxide; spin-on glasses; silsesquioxanes, including hydrogen silsesquioxane (HSQ), methyl silsesquioxane (MSQ) and mixtures or copolymers of HSQ and MSQ; benzocyclobutene (BCB)-based polymer dielectrics, and any silicon-containing low-k dielectric. Examples of spin-on low-k films with SiCOH-type composition using silsesquioxane chemistry include HOSP™ (available from Honeywell), JSR 5109 and 5108 (available from Japan Synthetic Rubber), Zirkon™ (available from Shipley Microelectronics, a division of Rohm and Haas), and porous low-k (ELk) materials (available from Applied Materials). Examples of carbon-doped silicon dioxide materials, or organosilanes, include Black Diamond™ (available from Applied Materials) and Coral™ (available from Lam Research). An example of an HSQ material is FOx™ (available from Dow Corning).

Structure 100 includes a resistor 130 (also referred to herein as "poly-resistor 130") including a doped buried polysilicon layer 132 under STI 110. Doped buried polysilicon layer 132 is denoted as 'buried' because of its location below an upper surface 134 of substrate 102 (same plane as upper surface of STI 110 in FIG. 1). Doped buried polysilicon layer 132 may include any dopant capable of controlling a resistivity of the layer. In one non-limiting example, doped buried polysilicon layer 132 under STI 110 may include a boron (B) dopant. However, it may be doped with other p-type or n-type dopants depending, for example, on the doping in substrate 102 or below a high resistivity (HR) polysilicon layer 140 (described herein) therebelow. Alternative dopants may include but are not limited to: other p-type dopants such as indium (In), aluminum (Al), and/or gallium (Ga), or n-type dopants such as phosphorous (P), arsenic (As), and/or antimony (Sb). A dopant concentration in doped buried polysilicon layer 132 may be controlled to dictate the resistivity of polysilicon layer 132.

Structure 100 also includes a high resistivity (HR) polysilicon layer 140 under doped buried polysilicon layer 132. HR polysilicon layer 140 may include a noble dopant capable of changing the crystalline structure of HR polysilicon layer 140 from that of substrate 102, creating a resistivity therein greater than substrate 102 and perhaps higher than doped buried polysilicon layer 132. The noble dopant may include, for example, argon (Ar), neon (Ne), krypton (Kr), xenon (Xe), helium (He), or a combination thereof. In one particular embodiment, argon (Ar) is used.

Structure 100 also includes a pair of contacts 144, 146 operatively coupled in a spaced manner to doped buried polysilicon layer 132. Contacts 144, 146 provide an electrically conductive pathway to resistor 130. In FIG. 1, each contact 144, 146 includes a doped monocrystalline semiconductor material 150 extending beside STI 110. That is, doped monocrystalline semiconductor material 150 is in substrate 102 and extends vertically along lateral sides 151 of STI 100. As shown in FIG. 1, each contact 144, 146 is operatively coupled to a lateral end 152 of doped buried polysilicon layer 132. Also, each contact 144, 146 contacts an upper surface 154 of HR polysilicon layer 140. Doped monocrystalline semiconductor material 150 may include a p-type or n-type dopant depending on, for example, the type of active devices formed elsewhere in active regions 120, 122. N-type dopants may include but are not limited to: phosphorous (P), arsenic (As), antimony (Sb). N-type is any element introduced to semiconductor to generate free electron (by "donating" electron to semiconductor); and must have one more valance electron than semiconductor. P-type dopants may include but are not limited to: boron (B), indium (In) and gallium (Ga). P-type is any element introduced to semiconductor to generate free hole (by "accepting" electron from semiconductor atom and "releasing" hole at the same time); and the acceptor atom must have one valence electron less than host semiconductor. An upper layer 158 of contacts 144, 146 may have a higher dopant concentration than doped monocrystalline semiconductor material 150. Any now known or later developed form of metal contact or wire 160 may be formed through ILD layer 124 to complete contacts 144, 146.

Figure 2:
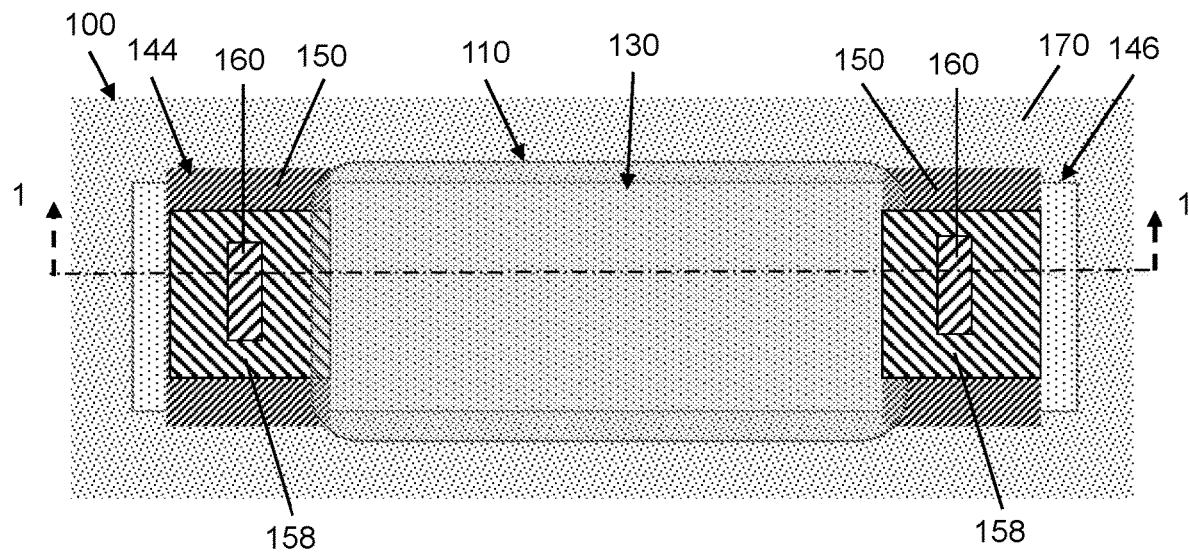
FIG. 2 shows a plan view of the structure of FIG. 1 (see view line 1-1) including the poly-resistor, according to embodiments of the disclosure.

FIG. 2 shows a plan view of structure 100. As shown in FIGS. 1 and 2, structure 100 may also include an isolation ring 170 bounding doped buried polysilicon layer 132. Isolation region 170 may include any now known or later developed electrical isolation structure. For example, isolation ring 170 may include a trench isolation or a doped well. Where a doped well is used, it will have a different polarity than contacts 144, 146, e.g., an n-well where doped monocrystalline semiconductor material 150 is doped with a p-type dopant. Where isolation ring 170 includes a trench isolation, it may include an STI, a deep trench isolation (DTI, as shown) or a dual STI. When in the form of a trench isolation, isolation ring 170 may be formed similarly to STI 110.

For purposes that will be described relative to methods herein, structure 100 may also optionally include a retarding implant region 174 (dashed line) within and/or below HR polysilicon layer 140, i.e., below HR polysilicon layer 140, within HR polysilicon layer 140, or both within and below HR polysilicon layer 140. Retarding implant region 174 may include any dopant capable of retarding the depletion of other dopants, such as boron (B) in resistor 130, beyond HR polysilicon layer 140 into substrate 102. In one non-limiting example, the dopant may include carbon (C).

Figure 3:
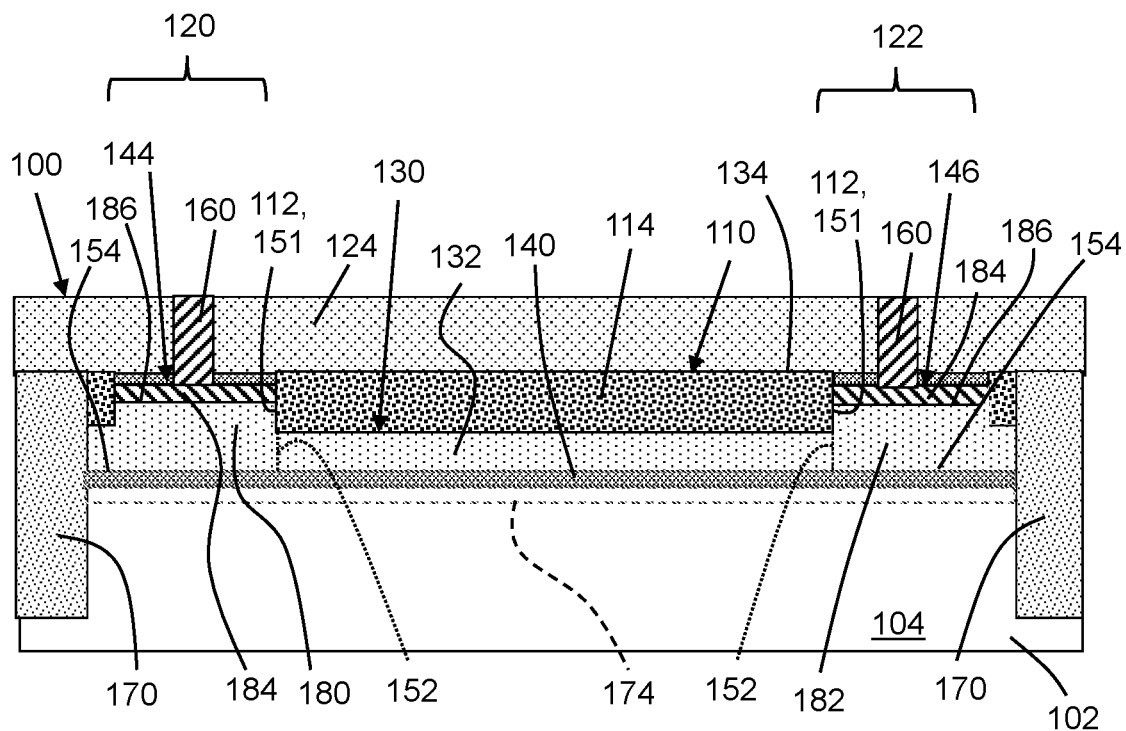
FIG. 3 shows a cross-sectional view of a structure including a poly-resistor, according to other embodiments of the disclosure.

FIG. 3 shows a cross-sectional view of structure 100 according to another embodiment of the disclosure. Structure 100 in FIG. 3 is substantially similar to that shown in FIGS. 1 and 2, except doped buried polysilicon layer 132 and contacts 144, 146 are different. In FIG. 3, doped buried polysilicon layer 132 includes a pair of vertical portions 180, 182 extending vertically along lateral sides 151 of STI 110. That is, the material and dopant in vertical portions 180, 182 matches that of doped buried polysilicon layer 132 in contrast to material 150 in FIGS. 1 and 2, which includes other dopants. In this manner, as observed in FIG. 3, resistor 130 and doped buried polysilicon layer 132 may have a U-shaped cross-section. Each contact 144, 146 in FIG. 3 may include a doped semiconductor material 184 operatively coupled to an upper surface 186 of a respective vertical portion 180, 182 of doped buried polysilicon layer 132. The dopant in doped semiconductor material 184 may be the same as in other areas of active regions 120, 122 (into or out of page). Any now known or later developed form of metal contact or wire 160 may be formed through ILD layer 124 to complete contacts 144, 146, i.e., doped semiconductor material 184.

Figure 4:
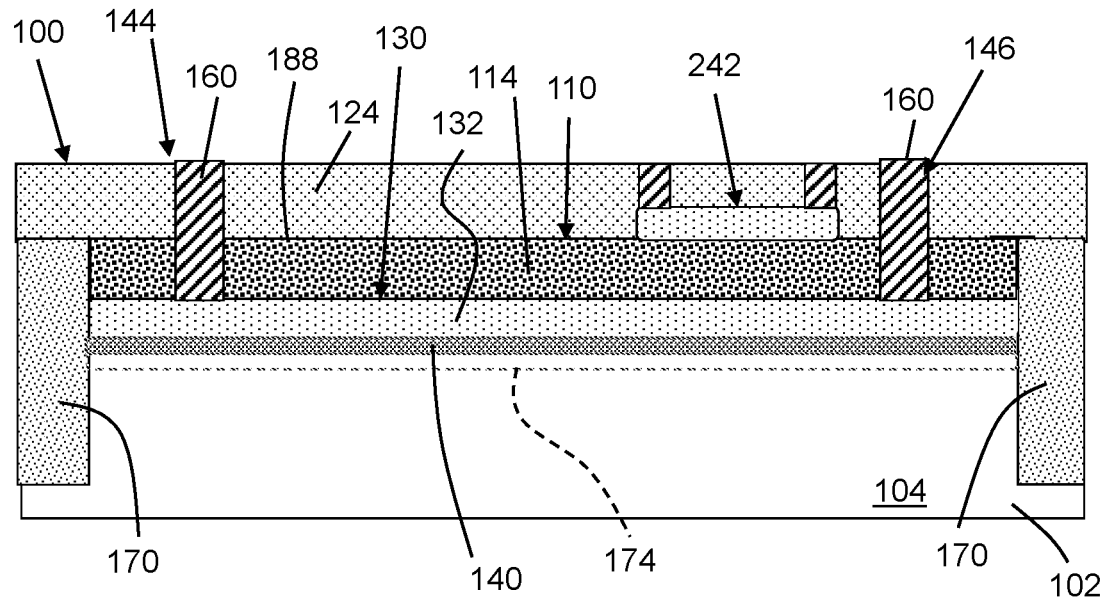
FIG. 4 shows a cross-sectional view of a structure including a poly-resistor, according to yet other embodiments of the disclosure.

FIG. 4 shows a cross-sectional view of structure 100, according to yet another embodiment. Structure 100 in FIG. 4 is substantially similar to that shown in FIGS. 1 and 2, except doped buried polysilicon layer 132 and contacts 144, 146 are different from that shown in FIGS. 1 and 3. In FIG. 4, each contact 144, 146 extends through STI 110 to an upper surface 188 of doped buried polysilicon layer 132. Here, contacts 144, 146 may include any now known or later developed form of metal contact or wire (similar to 160 in other embodiments) and may be formed through ILD layer 124 and STI 110 to land directly on doped buried polysilicon layer 132, i.e., resistor 130.

As will be recognized, where STI 110 forms spaced active regions 120, 122, a distance between active regions 120, 122 in FIGS. 1-4 may control a spacing between contacts 144, 146. In this manner, the length of resistor 130 and the resistance provided by resistor 130 can be further controlled.

Figure 5:
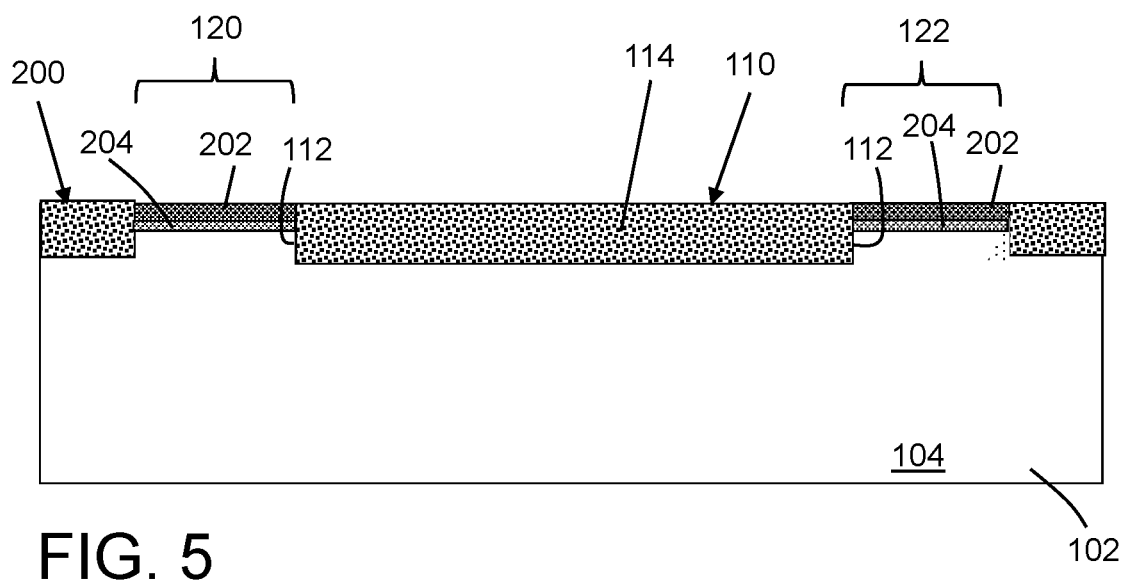
FIG. 5 shows a cross-sectional view of a preliminary structure for a method, according to embodiments of the disclosure.

Referring to FIGS. 5-13, methods of forming structure 100 according to various embodiments will be described. FIG. 5 shows a preliminary structure 200, and the forming of STI 110 in substrate 102. As noted, STI 110 may isolate a pair of spaced active regions 120, 122. STI 110 may be formed using any now known or later developed process, e.g., patterning a mask (not shown), etching openings into substrate 102, filling the openings with insulating material 114 (as listed herein), and planarizing. Etching generally refers to the removal of material from a substrate (or structures formed on the substrate), and is often performed with a mask in place so that material may selectively be removed from certain areas of the substrate, while leaving the material unaffected, in other areas of the substrate. There are generally two categories of etching, (i) wet etch and (ii) dry etch. Wet etch is performed with a solvent (such as an acid) which may be chosen for its ability to selectively dissolve a given material (such as oxide), while, leaving another material (such as polysilicon) relatively intact. This ability to selectively etch given materials is fundamental to many semiconductor fabrication processes. A wet etch will generally etch a homogeneous material (e.g., oxide) isotropically, but a wet etch may also etch single-crystal materials (e.g. silicon wafers) anisotropically. Dry etch may be performed using a plasma. Plasma systems can operate in several modes by adjusting the parameters of the plasma. Ordinary plasma etching produces energetic free radicals, neutrally charged, that react at the surface of the wafer. Since neutral particles attack the wafer from all angles, this process is isotropic. Ion milling, or sputter etching, bombards the wafer with energetic ions of noble gases which approach the wafer approximately from one direction, and therefore this process is highly anisotropic. Reactive-ion etching (RIE) operates under conditions intermediate between sputter and plasma etching and may be used to produce deep, narrow features, such as STI 110 openings/trenches. Preliminary structure 200 also includes a pad nitride layer 202 over a pad oxide layer 204 in active regions 120, 122, each of which may be formed using any now known or later developed process.

Figure 6:
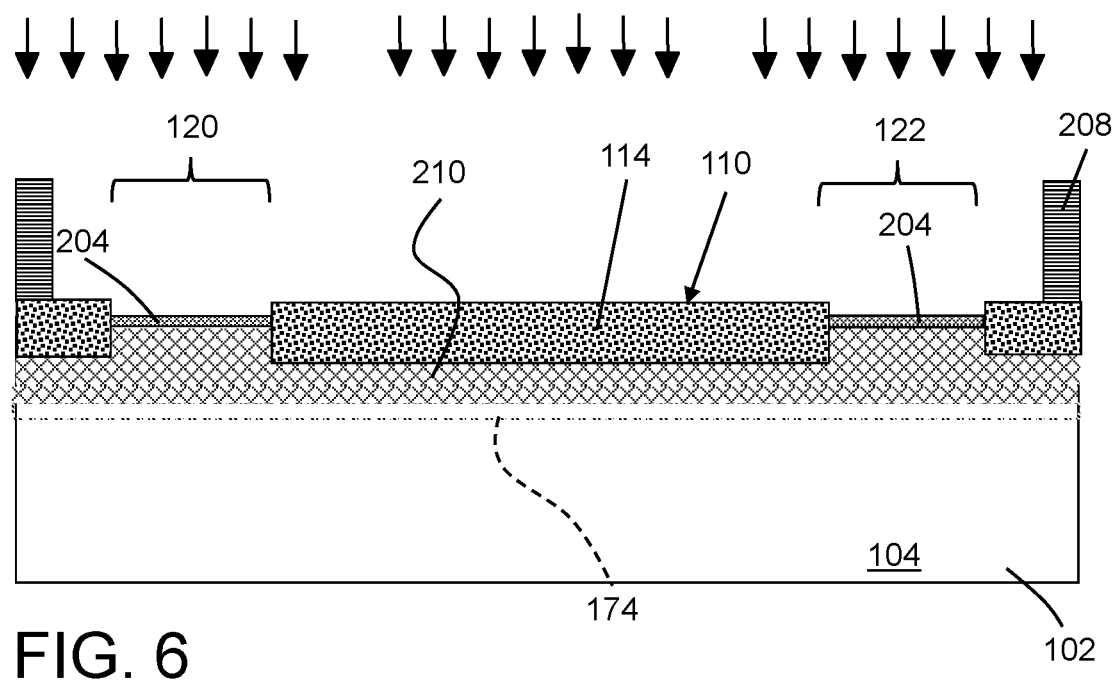
FIG. 6 shows a cross-sectional view of introducing a noble dopant to form a disordered crystallographic layer, according to embodiments of the disclosure.

FIGS. 6-9 show cross-sectional views of steps of forming structure 100 of FIG. 1. FIG. 6 shows a cross-sectional view of the structure after having optionally removed pad nitride layer 202, exposing pad oxide layer 204. Pad nitride layer 202 may be removed using any appropriate etching process, e.g., a hot phosphorous process. FIG. 6 also shows optionally doping to form a retarding implant region 174, which will ultimately be located within and/or below HR polysilicon layer 140. Any form of a mask 208 may be formed to direct the doping. Mask 208 may be any mask material patterned to form HR polysilicon layer 140, e.g., where shown in FIG. 6 and perhaps other active regions of the IC. Retarding implant region 174 may be formed using any now known or later developed doping process, such as in-situ formation or ion implanting. FIG. 6 also shows doping with a noble dopant, forming a disordered crystallographic layer 210 under STI 110 (and pair of spaced active regions 120, 122, where provided). As noted, the noble dopant may include, for example, argon (Ar), neon (Ne), krypton (Kr), xenon (Xe), helium (He), or a combination thereof. In one particular embodiment, argon (Ar) is used.

Figure 7:
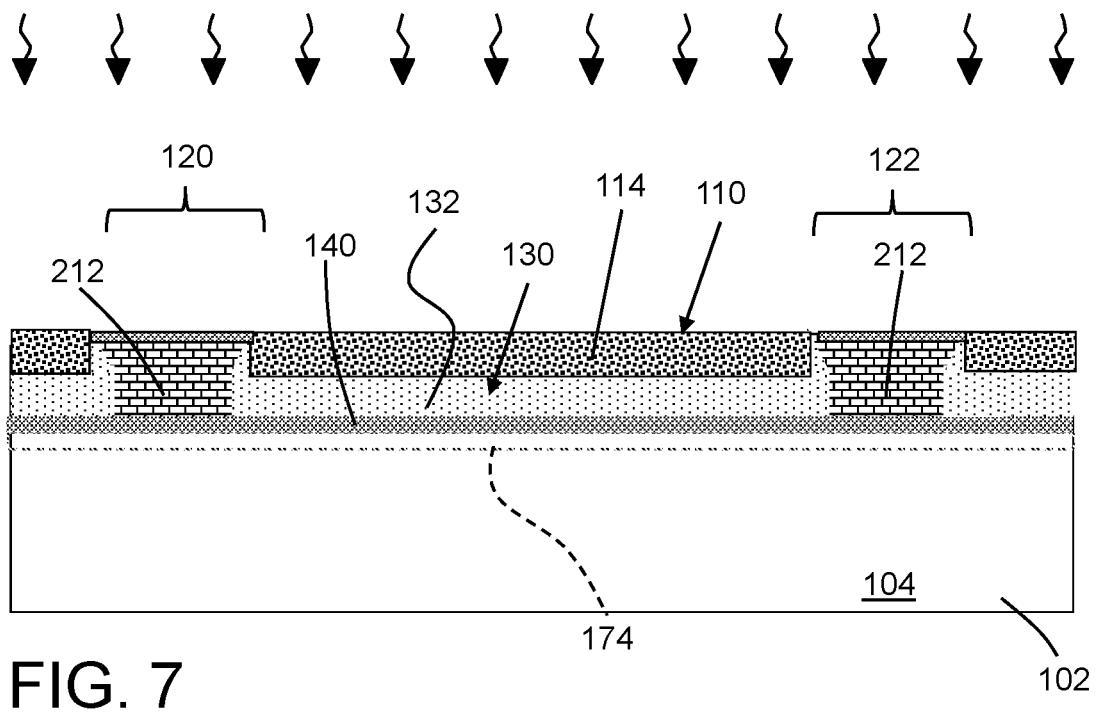
FIG. 7 shows a cross-sectional view of converting the disordered crystallographic layer of FIG. 6 to a doped buried polysilicon layer under an STI and a high-resistivity (HR) polysilicon layer under the doped buried polysilicon layer, according to embodiments of the disclosure.

FIG. 7 shows converting disordered crystallographic layer 210 (FIG. 6) to doped buried polysilicon layer 130 under STI 110 and HR polysilicon layer 140 under doped buried polysilicon layer 130, i.e., after removing mask 208 using any appropriate ashing process. In one embodiment, the conversion can be accomplished by annealing. The anneal can include, for example, any appropriate rapid thermal process (RTP) and can have any temperature and/or duration to obtain the desired depth of layers 132, 140. Where provided, retarding implant region 174 may limit the extent to which layers 132, 140 extend into substrate 102. Otherwise, the dopant concentrations in layers 132, 140 and the conversion process may control the thicknesses of layer 132, 140. As shown in FIG. 7, the conversion creates HR polysilicon layer 140, doped buried semiconductor layer 132, and (recrystallized) monocrystalline semiconductor material 212 over doped buried semiconductor layer 132.

Figure 8:
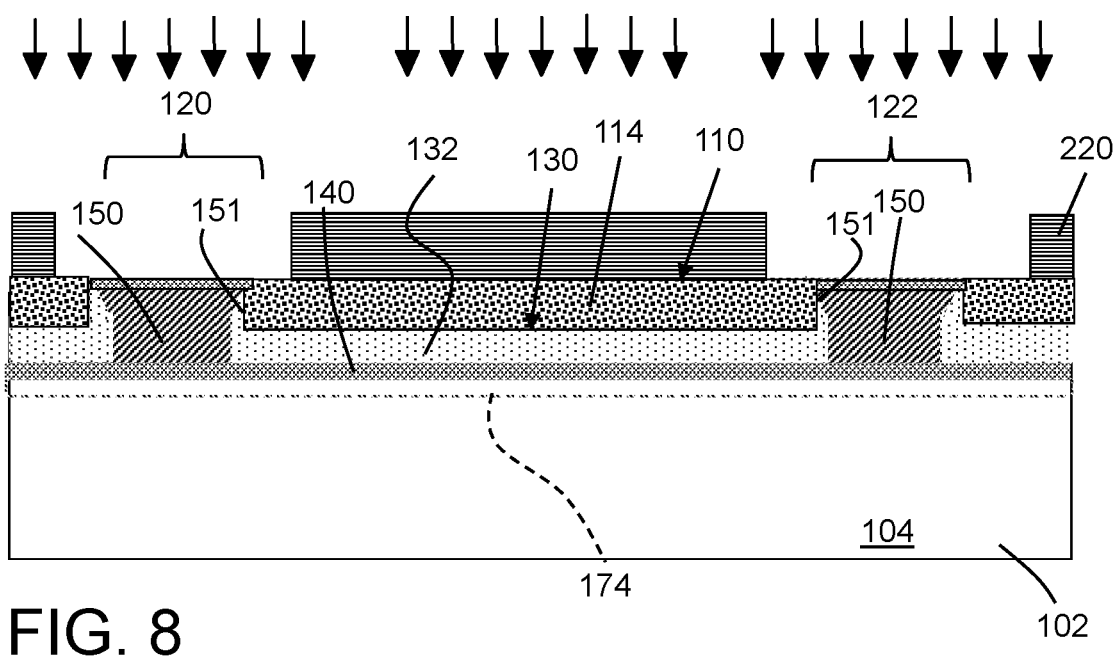
FIG. 8 shows a cross-sectional view of introducing a first dopant to form contacts for the poly-resistor, according to embodiments of the disclosure.
Figure 9:
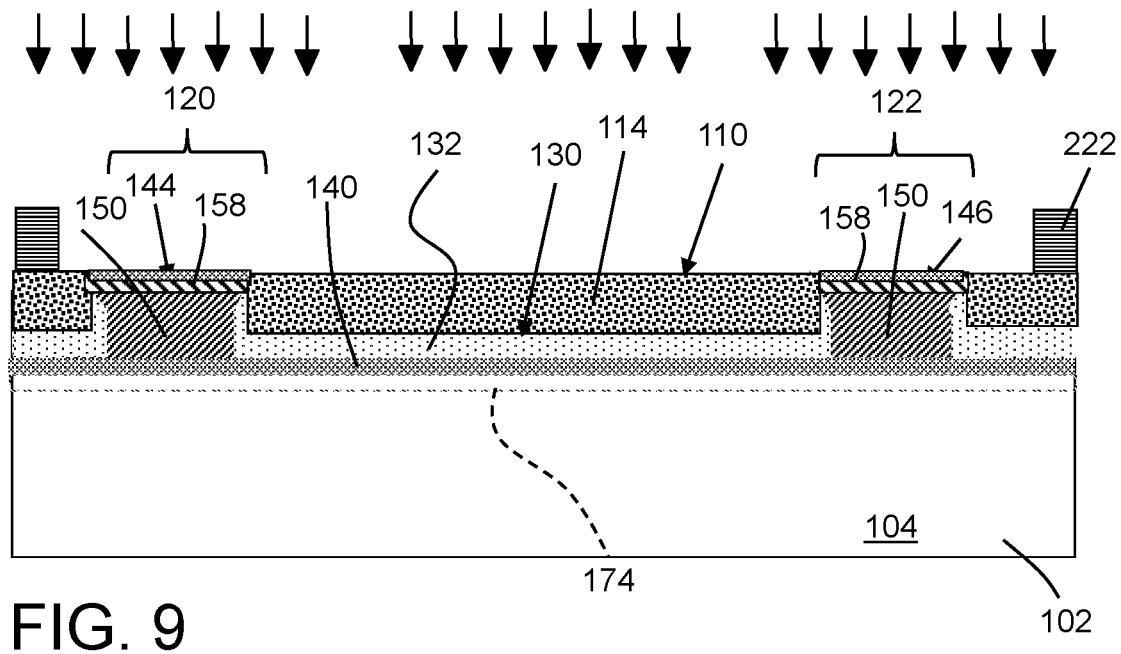
FIG. 9 shows a cross-sectional view of introducing a second dopant to form contacts for the poly-resistor, according to embodiments of the disclosure.

FIGS. 8-9 show cross-sectional views of forming a pair of contacts 144, 146 operatively coupled in a spaced manner to doped buried polysilicon layer 132. In FIG. 8, a mask 220 is formed exposing active regions 120, 122. FIG. 8 also shows introducing a dopant into monocrystalline semiconductor material 212 to form doped monocrystalline semiconductor material 150 extending beside STI 110. That is, doped monocrystalline semiconductor material 150 is in substrate 102 and extends vertically along lateral sides 151 of STI 100. The dopant may be introduced in any manner such as ion implantation. Mask 220 may be removed using any appropriate ashing process. FIG. 9 shows forming another mask 222 exposing active regions 120, 122 and STI 110. Mask 222 may be the same as that used for doping of source/drain regions (not shown) of active devices in other regions of the IC. FIG. 8 shows introducing a dopant into monocrystalline semiconductor material 212 to form upper layer 158 of contacts 144, 146 having a higher dopant concentration than doped monocrystalline semiconductor material 150. Mask 222 may be removed using any appropriate ashing process, and ILD layer 124 (FIG. 1) formed over the structure. As shown in FIG. 1, any now known or later developed form of metal contact or wire 160 may be formed through ILD layer 124 to complete contacts 144, 146.

Figure 10:
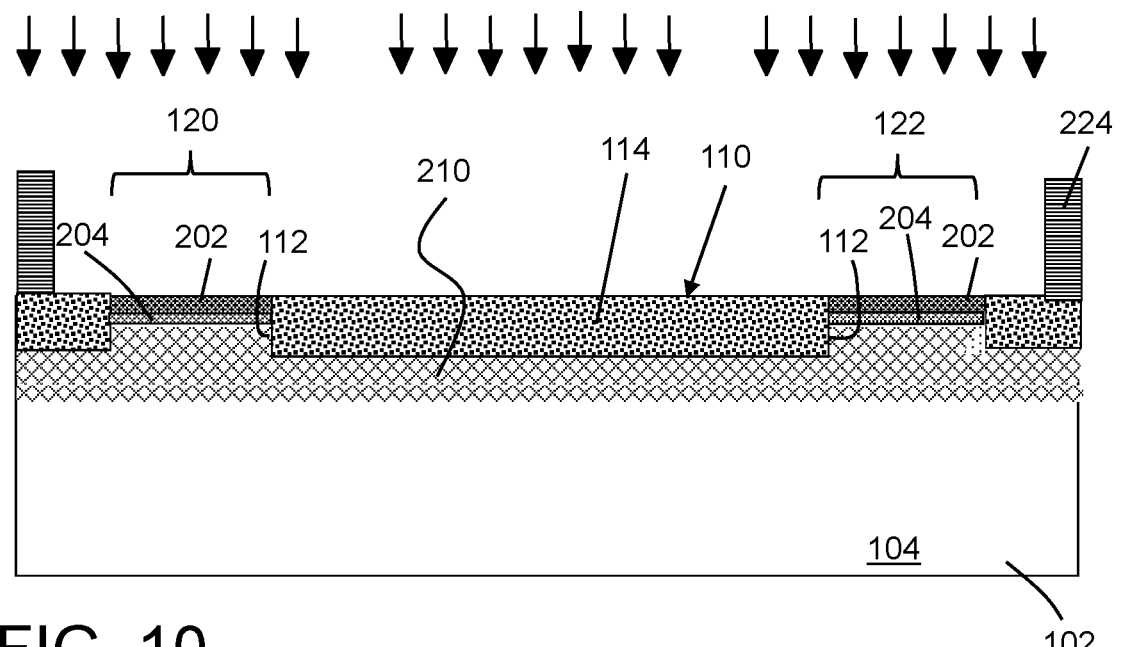
FIG. 10 shows a cross-sectional view of introducing a noble dopant to form a disordered crystallographic layer, according to other embodiments of the disclosure.
Figure 11:
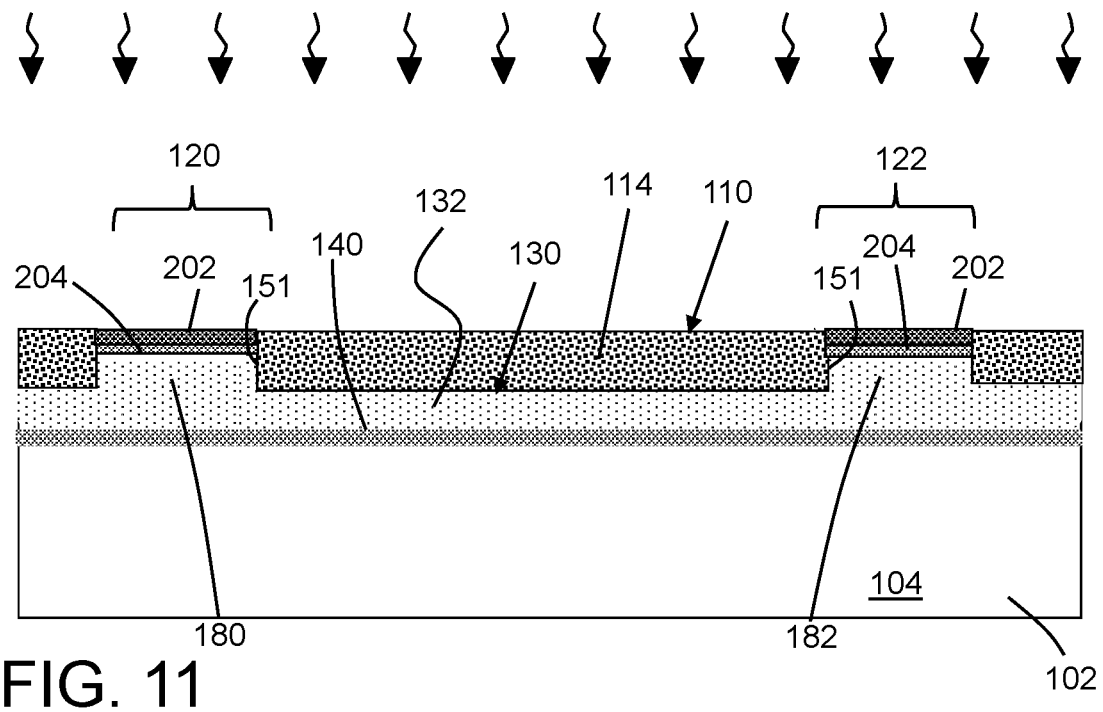
FIG. 11 shows a cross-sectional view of converting the disordered crystallographic layer of FIG. 10 to a doped buried polysilicon layer under an STI and an HR polysilicon layer under the doped buried polysilicon layer, according to other embodiments of the disclosure.
Figure 12:
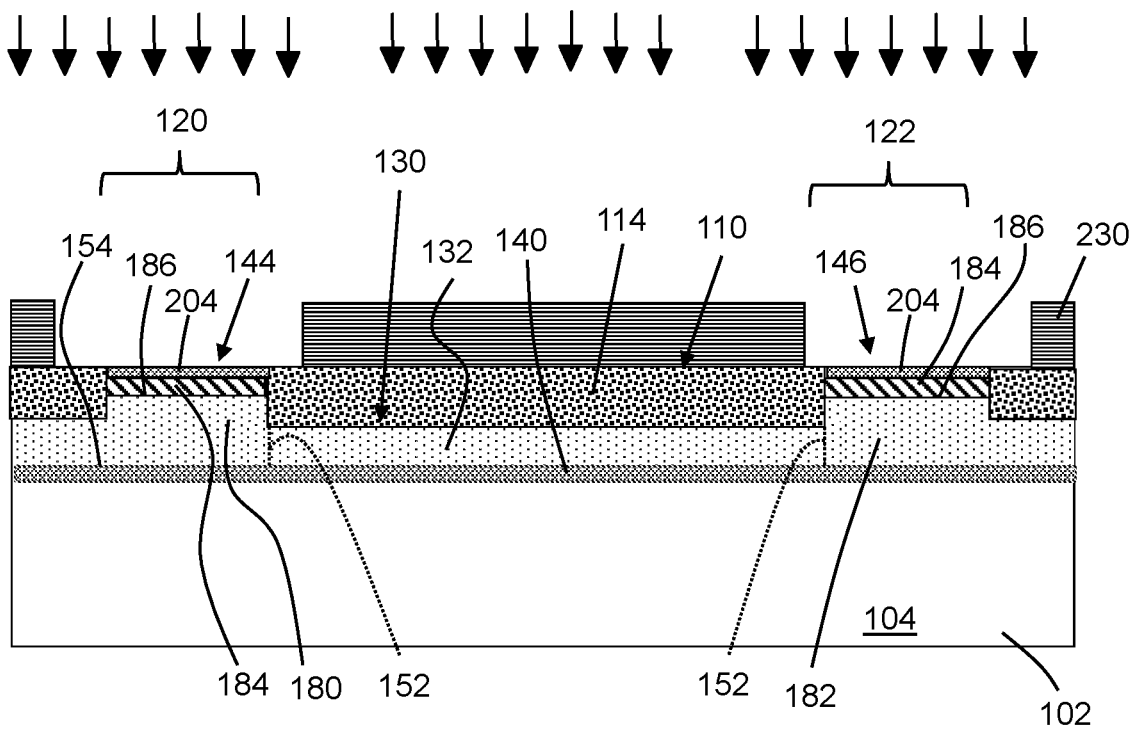
FIG. 12 shows a cross-sectional view of introducing a dopant to form contacts for the poly-resistor, according to embodiments of the disclosure.

FIGS. 10-12 show cross-sectional views for forming structure 100 as illustrated in FIG. 3. FIG. 10 shows a cross-sectional view with a mask 224 formed on the structure, similarly to that illustrated in FIG. 5. Here, in contrast to FIGS. 6-9, pad nitride layer 202 remains over active regions 120, 122. That is, each active region 120, 122 includes pad nitride layer 204 thereover during the doping of STI 210 and the spaced active regions 120, 122 with the noble dopant, as will be described. Pad nitride layer 202 prevents recrystallization of vertical portions 180, 182 (FIG. 3) beside STI 110. Mask 224 exposes active regions 120, 122 and STI 110. At this stage, retarding implant region 174 may be formed by doping (e.g., ion implantation) to be ultimately located within and/or below HR polysilicon layer 140. However, this process is not shown in FIG. 10 to illustrate the option of omitting this step. Any form of a mask 224 may be formed to direct the doping. Mask 224 may be any mask material patterned to form HR polysilicon layer 140, e.g., where shown in FIG. 10 and perhaps other active regions of the IC. FIG. 10 also shows doping with a noble dopant, forming a disordered crystallographic layer 210 under STI 110 (and pair of spaced active regions 120, 122, where provided). As noted, the noble dopant may include, for example, argon (Ar), neon (Ne), krypton (Kr), xenon (Xe), helium (He), or a combination thereof. In one particular embodiment, argon (Ar) is used.

FIG. 11 shows converting disordered crystallographic layer 210 (FIG. 10) to doped buried polysilicon layer 130 under STI 110 and HR polysilicon layer 140 under doped buried polysilicon layer 130, i.e., after removing mask 224 (FIG. 10) using any appropriate ashing process. In one embodiment, the conversion can be accomplished by annealing. As noted, the anneal can include, for example, any appropriate rapid thermal process (RTP) and can have any temperature and/or duration to obtain the desired depth of layers 132, 140. Where provided, retarding implant region 174 (not shown) may limit the extent to which layers 132, 140 extend into substrate 102. Otherwise, the dopant concentrations in layers 132, 140 and the conversion process may control the thicknesses of layer 132, 140. Here, due to the presence of pad nitride layer 202, doped buried polysilicon layer 132 includes vertical portions 180, 182 extending vertically along lateral sides 152 of STI 110 in each active region 120, 122. Hence, the conversion creates HR polysilicon layer 140, doped buried semiconductor layer 132, and vertical portions 180, 182 of doped buried semiconductor layer 132 extending along lateral sides 151 of STI 110.

FIG. 12 shows a cross-sectional view of removing pad nitride layer 202, e.g., with a hot phosphorous process. FIG. 12 also shows forming pair of contacts 144, 146 by forming a doped polycrystalline semiconductor material 184 operatively coupled to upper surface 186 of vertical portion 180, 182 of doped buried polysilicon layer 132 in each active region 120, 122. More particularly, FIG. 12 shows forming a mask 230 and introducing a dopant to form doped polycrystalline semiconductor material 184, e.g., by ion implantation through pad oxide layer 204. FIG. 3 shows structure 100, after removing mask 230, and forming metal contacts or wires 160 through ILD layer 124 and pad oxide layer 204 (FIG. 12) to complete contacts 144, 146, as described herein.

Figure 13:
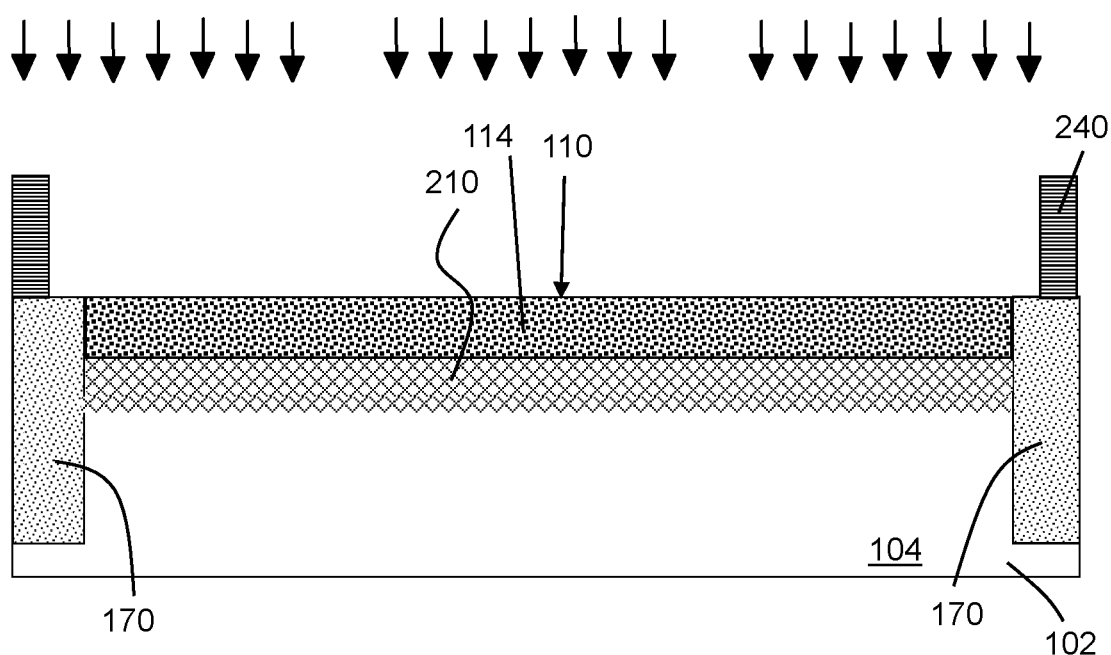
FIG. 13 shows a cross-sectional view of introducing a noble dopant to form a disordered crystallographic layer, according to yet other embodiments of the disclosure.

FIG. 13 shows a cross-sectional view of forming structure 100 as illustrated in FIG. 4. The FIG. 4 embodiment does not include active regions 120, 122. In this case, structure 100 may be formed with less steps than the FIGS. 1 and 3 embodiments. FIG. 13 shows an optional mask 240 exposing STI 110. At this stage, retarding implant region 174 (not shown) may be optionally formed by doping (e.g., ion implantation). However, this process is not shown in FIG. 13 to illustrate the option of omitting this step. Any form of mask 240 may be formed to direct the doping. For example, mask 240 may be any mask material patterned to form HR polysilicon layer 140, e.g., where shown in FIG. 4 and perhaps other active regions of the IC. FIG. 13 also shows doping with a noble dopant, forming a disordered crystallographic layer 210 under STI 110. As noted, the noble dopant may include, for example, argon (Ar), neon (Ne), krypton (Kr), xenon (Xe), helium (He), or a combination thereof. In one particular embodiment, argon (Ar) is used.

FIG. 4 shows converting disordered crystallographic layer 210 (FIG. 13) to doped buried polysilicon layer 130 under STI 110 and HR polysilicon layer 140 under doped buried polysilicon layer 130, i.e., after removing mask 240 (FIG. 13) using any appropriate ashing process. As noted, the conversion can be accomplished by annealing, as described herein. Where provided, retarding implant region 174 (not shown) may limit the extent to which layers 132, 140 extend into substrate 102. Otherwise, the dopant concentrations in layers 132, 140 and the conversion process may control the thicknesses of layer 132, 140. As shown in FIG. 4, in this embodiment, forming pair of contacts 144, 146 includes forming metal contacts or wires 160 that extend through STI 110 to upper surface 188 of doped buried polysilicon layer 132. Metal contacts or wires 160 may be formed using any now known or later developed contact/wire forming processes. In one non-limiting example, contacts or wires 160 may be formed by patterning a mask, etching opening(s) to the respective depth, and forming a conductor in the opening(s). The conductor may include refractory metal liner, and a contact or wire metal. The refractory metal liner (not labeled for clarity) may include, for example, ruthenium (Ru), tantalum (Ta), titanium (Ti), tungsten (W), iridium (Ir), rhodium (Rh) and platinum (Pt), etc., or mixtures of thereof. The metal of contact or wire may be any now known or later developed contact/wire metal such as but not limited to copper (Cu) or tungsten (W).

In any of the method embodiments described herein, isolation ring 170 may be formed at any desired juncture, e.g., with STI 110. Where isolation ring 170 includes a trench isolation, it may formed in a substantially similar manner as STI 110.

Embodiments of the disclosure provide a structure 100 for providing a poly-resistor 130. As shown in FIGS. 1, 3 and 4, structure 100 does not include oxide/STI under resistor 120, which improves the resistor's thermal dissipation to substrate 102. The structure also allows improved resistor density (with less area) by allowing stacked poly-resistors below STI 110 and above STI 110—see additional resistor 242 above STI 110 in FIG. 4. Additional resistor 242 may be employed in any embodiment. HR polysilicon layer 140 provides an isolation region beneath poly-resistor 130 that diminishes parasitic leakage of active devices to substrate 102. See U.S. Pat. No. 10,192,779. Here, HR polysilicon layer 140 also provides improved thermal conductivity from poly-resistor 130 with reduced substrate coupling, and improved frequency response.

The method and structure as described above are used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. "Optional" or "optionally" means that the subsequently described event or circumstance may or may not occur, and that the description includes instances where the event occurs and instances where it does not.

Approximating language, as used herein throughout the specification and claims, may be applied to modify any quantitative representation that could permissibly vary without resulting in a change in the basic function to which it is related. Accordingly, a value modified by a term or terms, such as "about", "approximately" and "substantially", are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise. "Approximately" as applied to a particular value of a range applies to both values, and unless otherwise dependent on the precision of the instrument measuring the value, may indicate +/−10% of the stated value(s).

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

What is claimed is:

1. A structure, comprising:
a shallow trench isolation (STI) including a lower surface;
a doped buried polysilicon layer at least partially under the lower surface of the STI;
a high resistivity (HR) polysilicon layer under the doped buried polysilicon layer; and
a pair of contacts operatively coupled in a spaced manner to the doped buried polysilicon layer.

2. The structure of claim 1, wherein the HR polysilicon layer includes a noble dopant.

3. The structure of claim 1, wherein the doped buried polysilicon layer under the STI includes a boron dopant.

4. The structure of claim 1, further comprising an isolation ring bounding the doped buried polysilicon layer.

5. The structure of claim 4, wherein the isolation ring is one of a trench isolation and a doped well.

6. The structure of claim 1, further comprising a retarding implant region below the HR polysilicon layer, within the HR polysilicon layer, or both within and below the HR polysilicon layer.

7. The structure of claim 1, wherein each contact includes a doped monocrystalline semiconductor material extending beside the STI, and each contact is operatively coupled to a lateral end of the doped buried polysilicon layer.

8. The structure of claim 7, wherein each contact contacts an upper surface of the HR polysilicon layer.

9. The structure of claim 1, wherein the doped buried polysilicon layer includes a pair of vertical portions extending vertically along lateral sides of the STI, wherein each contact includes a doped semiconductor material operatively coupled to an upper surface of a respective vertical portion of the doped buried polysilicon layer.

10. The structure of claim 1, wherein each contact extends through the STI to an upper surface of the doped buried polysilicon layer, and each contact is in contact with the STI.

11. A structure, comprising:
a shallow trench isolation (STI) including a lower surface;
a resistor including a doped buried polysilicon layer at least partially under the lower surface of the STI;
a high resistivity (HR) polysilicon layer under the resistor; and
a pair of contacts operatively coupled in a spaced manner to the resistor,
wherein the HR polysilicon layer includes a noble dopant, and
wherein the doped buried polysilicon layer includes a boron dopant.

12. The structure of claim 11, further comprising an isolation ring bounding the doped buried polysilicon layer.

13. The structure of claim 11, wherein each contact includes a doped monocrystalline semiconductor material extending beside the STI, and each contact is operatively coupled to a lateral end of the doped buried polysilicon layer, wherein each contact contacts an upper surface of the HR polysilicon layer.

14. The structure of claim 11, wherein the doped buried polysilicon layer includes a pair of vertical portions extending vertically along lateral sides of the STI, wherein each contact includes a doped semiconductor material operatively coupled to an upper surface of a respective vertical portion of the doped buried polysilicon layer.

15. The structure of claim 11, wherein each contact extends through the STI to an upper surface of the doped buried polysilicon layer, and each contact is in contact with the STI.

* * * * *